(12) United States Patent
Tamura et al.

(10) Patent No.: US 10,432,204 B2
(45) Date of Patent: Oct. 1, 2019

(54) ATOMIC OSCILLATOR

(71) Applicant: Seiko Epson Corporation, Tokyo (JP)

(72) Inventors: Tomohiro Tamura, Matsumoto (JP); Koji Chindo, Suwa (JP)

(73) Assignee: Seiko Epson Corporation (JP)

( * ) Notice: Subject to any disclaimer, the term of this patent is extended or adjusted under 35 U.S.C. 154(b) by 34 days.

(21) Appl. No.: 15/696,478

(22) Filed: Sep. 6, 2017

(65) Prior Publication Data

US 2018/0069560 A1 Mar. 8, 2018

(30) Foreign Application Priority Data

Sep. 7, 2016 (JP) .................. 2016-174309

(51) Int. Cl.
*H03L 7/26* (2006.01)
*G04F 5/14* (2006.01)

(52) U.S. Cl.
CPC ............. *H03L 7/26* (2013.01); *G04F 5/145* (2013.01)

(58) Field of Classification Search
CPC .................. H03L 7/26; G04F 5/145
See application file for complete search history.

(56) References Cited

U.S. PATENT DOCUMENTS

| | | | |
|---|---|---|---|
| 2007/0241097 A1* | 10/2007 | Shibata | G04F 5/14 |
| | | | 219/492 |
| 2009/0302956 A1 | 12/2009 | Matsuura | |
| 2012/0235754 A1 | 9/2012 | Chindo | |
| 2015/0171876 A1* | 6/2015 | Tanaka | H03L 7/26 |
| | | | 331/94.1 |

FOREIGN PATENT DOCUMENTS

| | | |
|---|---|---|
| JP | 2001-339302 A | 12/2001 |
| JP | 2009-231688 A | 10/2009 |
| JP | 2009-302118 A | 12/2009 |
| JP | 2011-199329 A | 10/2011 |
| JP | 2012-191138 A | 10/2012 |
| JP | 2014-099728 A | 5/2014 |

* cited by examiner

*Primary Examiner* — Jeffrey M Shin
(74) *Attorney, Agent, or Firm* — Harness, Dickey & Pierce, P.L.C.

(57) ABSTRACT

An atomic oscillator includes a gas cell encapsulating metal atoms, a coil disposed in a periphery of the gas cell, a laser source adapted to emit excitation light toward the gas cell, a heater adapted to heat the gas cell, and a wiring board adapted to supply the heater with power, and a plus line forming a plus current channel for the heater and provided to the wiring board, and a minus line forming a minus current channel for the heater and provided to the wiring board are disposed close to each other.

5 Claims, 12 Drawing Sheets

ATOMIC OSCILLATOR

This application claims priority to Japanese Patent Application No. 2016-174309, filed Sep. 7, 2016, the entirety of which is hereby incorporated by reference.

BACKGROUND

1. Technical Field

The present invention relates to an atomic oscillator.

2. Related Art

There is known an atomic oscillator, which oscillates based on the energy transition of an atom of alkali metal such as rubidium or cesium. In general, the operation principles of atomic oscillators are roughly classified into a system using a double resonance phenomenon due to light and microwave, and a system using the quantum interference effect (coherent population trapping (CPT)) due to two types of light different in wavelength from each other.

In the atomic oscillator of either of the systems, the alkali metal is encapsulated in a gas cell together with a buffer gas, how much the light having entered the gas cell is absorbed by the alkali metal is detected by a detector disposed on the opposite side to thereby detect atomic resonance, and the atomic resonance thus detected is output by a control system as a reference signal. As such an atomic oscillator, there has been disclosed a configuration in which the gas cell is disposed on a substrate, and a light source of the light (excitation light) and the detector are disposed on both sides across the gas cell from each other (see, e.g., JP-A-2009-231688).

Further, a heater is provided for preventing destabilization of the frequency due to a temperature variation, and further, a coil for forming a magnetic field in the gas cell is provided for making the transition frequency between the levels of the metal atoms in the gas cell constant. In JP-A-2001-339302, there is disclosed the fact that the heater and the coil are realized by a coil function switcher, which makes the coil function as the heater in order to stabilize the atomic oscillator at the startup, and makes the coil function as the coil for generating the magnetic field in the steady operation.

However, since a variation of the external environment causes the temperature of the atomic oscillator in operation to vary, it is necessary to keep the gas cell at a predetermined temperature with a heater. However, it is unachievable for the configuration of JP-A-2001-339302 to use the coil as the heater during the operation of the atomic oscillator.

Therefore, the coil for generating the magnetic field and the heater are separately provided to thereby keep the temperature of the gas cell at the predetermined temperature against the variation of the external environment. However, in order to make the heater generate heat, a current flows through wiring, and thus, the wiring generates a magnetic field although the magnetic field is weak. Due to the progress of the miniaturization and the reduction in height of the atomic oscillator, there is a possibility that the magnetic field, although weak, affects the magnetic field, which is formed by the coil for generating the magnetic field in the gas cell, to make the operation of the atomic oscillator unstable.

SUMMARY

An advantage of some aspects of the invention is to appropriately arrange the wiring as the power supply path to the heater for keeping the temperature of the gas cell to thereby reduce the influence of the magnetic field generated by the wiring on the magnetic field in the gas cell.

The can be implemented as the following forms or application examples.

Application Example 1

An atomic oscillator according to this application example includes at least a gas cell encapsulating metal atoms, a coil disposed in a periphery of the gas cell, a laser source adapted to emit excitation light toward the gas cell, a heater adapted to heat the gas cell, and a wiring board adapted to supply the heater with power, and a plus line forming a plus current channel for the heater and provided to the wiring board, and a minus line forming a minus current channel for the heater and provided to the wiring board are disposed close to each other.

According to the atomic oscillator related to this application example, the plus line and the minus line are disposed close to each other, and the direction of the current flowing through the plus line and the direction of the current flowing through the minus line are opposite to each other. By the current flowing through the plus line and the minus line, magnetic fields are excited in the respective lines. The magnetic field thus excited is formed so that the direction of the magnetic field line is clockwise viewed along the current flow direction, and the direction of the magnetic field line of the magnetic field excited from the plus line and the direction of the magnetic field line of the magnetic field excited from the minus line are opposite to each other.

Thus, the magnetic field lines act on each other so as to reinforce each other's magnetic field in the area between the plus line and the minus line made close to each other, but in the area of the gas cell distant from the plus line and the minus line, the magnetic field lines act on each other so as to cancel out each other.

Therefore, in the forming area of the magnetic field excited by the coil in the gas cell, the magnetic field excited by the plus line and thus excited from the wiring board and the magnetic field excited by the minus line and thus excited from the wiring board are canceled out each other, and thus it is possible to obtain the atomic oscillator provided with a stable oscillation performance.

Application Example 2

In the application example described above, it is possible that the wiring board is a flexible board, and the plus line and the minus line are stacked one another via an insulating layer.

According to this application example, by stacking the plus line and the minus line one another, it is possible to dispose the plus line and the minus line closer to each other. Further, the magnetic fields excited respectively from the plus line and the minus line act on each other so as to cancel out each other.

Application Example 3

In the application example described above, it is possible that the heater is a field-effect transistor, the plus line is connected to a source terminal of the field-effect transistor, the minus line is connected to a drain terminal of the field-effect transistor, and a gate line to be connected to a gate terminal of the field-effect transistor is adjacent to either one of the plus line and the minus line via an insulating layer.

According to this application example, by using the field-effect transistor as the heater, it is possible to achieve the temperature control with high accuracy, and realize miniaturization of the heater. Therefore, it is possible to obtain a small-sized atomic oscillator provided with high reliability.

Application Example 4

In the application example described above, it is possible that the heater is a bipolar transistor, the plus line is connected to a collector terminal of the bipolar transistor, the minus line is connected to an emitter terminal of the bipolar transistor, and a base line to be connected to a base terminal of the bipolar transistor of the wiring board is adjacent to either one of the plus line and the minus line via an insulating layer.

According to this application example, by using the bipolar transistor as the heater, it is possible to achieve the temperature control with high accuracy, and provide a highly reliable heater. Therefore, it is possible to obtain an atomic oscillator provided with high reliability.

Application Example 5

In the application example described above, it is possible that the flexible board further includes two ground lines at least via insulating layers, and the plus line and the minus line are stacked one another via the insulating layer between the two ground lines.

According to this application example, it is possible to block the magnetic field generated each of the plus line and the minus line with the ground lines made of an electrically conductive material. Therefore, it is possible to obtain an atomic oscillator provided with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some embodiments will hereinafter be described with reference to the drawings.

First Embodiment

Figure 1:
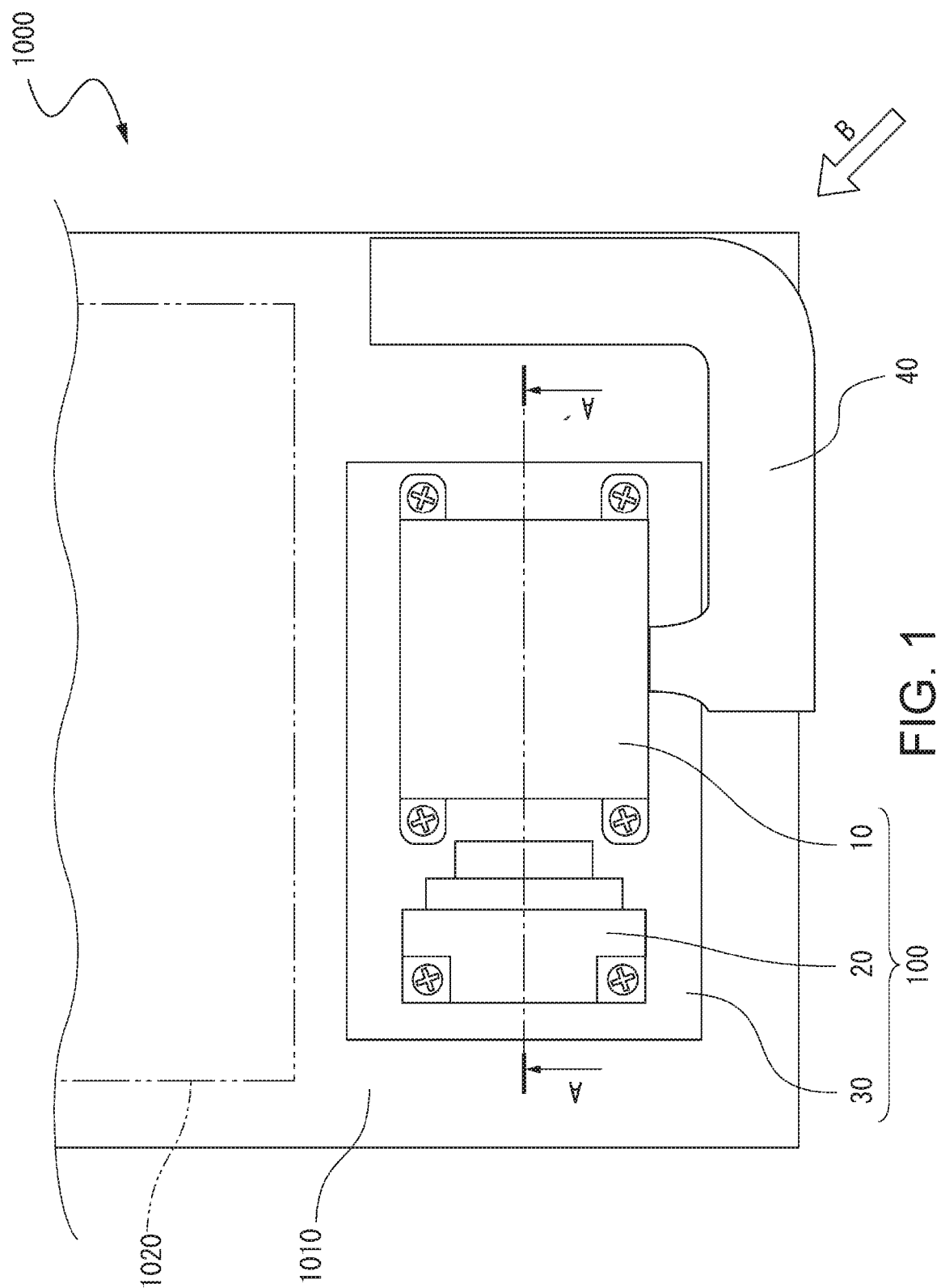
FIG. 1 is a planar appearance view showing an atomic oscillation device equipped with an atomic oscillator according to a first embodiment of the invention.

FIG. 1 is a planar appearance view showing an atomic oscillation device equipped with an atomic oscillator using the quantum interference effect according to a first embodiment of the invention. In an atomic oscillation device 1000 shown in FIG. 1, an atomic oscillator 100, and a controller 1020 equipped with a variety of electronic components not shown are mounted on a substrate 1010. In the atomic oscillator 100, a gas cell unit 10 housing metal atoms described later, and a light source unit 20 as a laser source for emitting a laser as excitation light to the gas cell unit 10 are disposed on a base 30.

Figure 2:
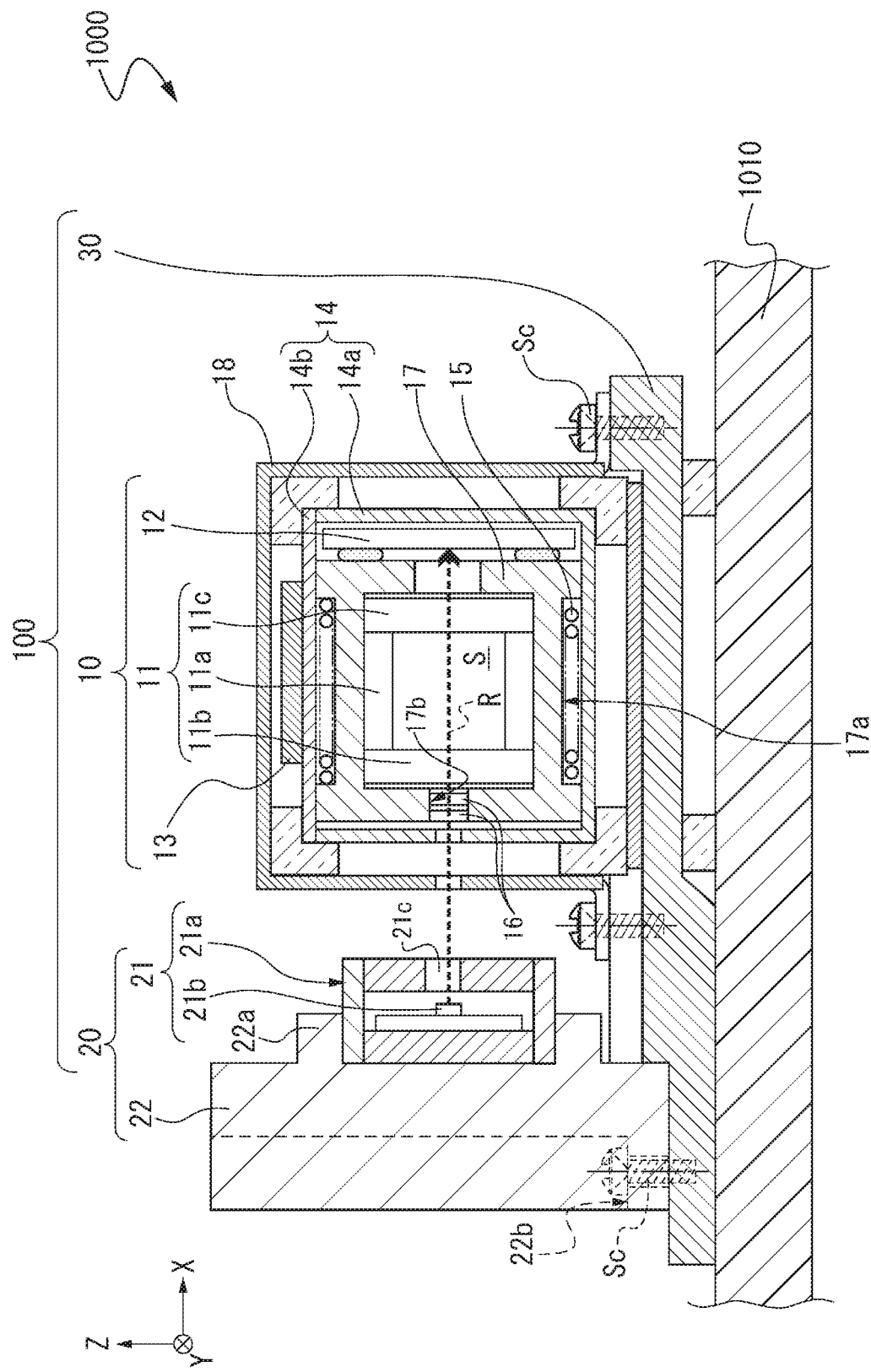
FIG. 2 is a schematic cross-sectional view of the part A-A' shown in FIG. 1.

FIG. 2 is a schematic cross-sectional view of the part A-A' shown in FIG. 1. As shown in FIG. 2, in the atomic oscillator 100 provided to the atomic oscillation device 1000, the light source unit 20 including a light emitter 21, and the gas cell unit 10 including a gas cell 11 and a light detector 12 are mounted on the base 30. Further, the atomic oscillator 100 is mounted and disposed on the substrate 1010 of the atomic oscillation device 1000.

The light source unit 20 is provided with the light emitter 21 and a light source holder 22 for holding the light emitter 21. The light source holder 22 has a mounter 22a to which the light emitter 21 is mounted, and a fixer 22b for fixedly mounting the light source holder 22 to the base 30. The fixer 22b is fixedly mounted on the base 30 with screws Sc in the present embodiment.

The light source unit 20 has a light source container 21a, and a light source 21b fixedly housed in the light source container 21a. The light source 21b has a function of emitting the excitation light LL for exciting the alkali metal atoms in the gas cell 11 described later. The light source 21b is disposed inside the light source container 21a along the emission direction (the optical axis direction R indicated by the arrow in the drawing) of the excitation light LL so as to be opposed to the gas cell 11. A through hole 21c is provided in an area crossing the emission direction (the optical axis direction R) of the excitation light LL, and the excitation light LL is emitted from the light source 21b toward the gas cell 11 through the through hole 21c.

The gas cell unit 10 including the gas cell 11 has the following configuration. In the central part of the gas cell unit 10, there is disposed the gas cell 11 constituted by a main body 11a having a cylindrical through hole and a pair of windows 11b, 11c, and in the gas cell 11, an internal space S is formed by blocking openings on both sides of the cylindrical through hole of the main body 11a with the pair of windows 11b, 11c. In the internal space S of the gas cell 11, there is encapsulated a gaseous alkali metal such as rubidium, cesium, or sodium.

The gas cell 11 is covered with a gas cell holding member 17 for holding the gas cell 11 to conduct the heat generated by a heater describe later to the gas cell 11. Further, a coil 15 is wound around an outer circumference 17a along the X-axis direction shown in the drawing of the gas cell holding member 17.

A through hole 17b is formed on the light emitter 21 side at a crossing part between the gas cell holding member 17 and the optical axis direction R, and the excitation light LL emitted from the light emitter 21 is transmitted through an optical component 16 disposed in the through hole 17b. The optical component 16 is formed of a λ/4 wave plate and a dimming filter (ND filter). The λ/4 wave plate converts the excitation light LL from the light source 21b from linearly polarized light into circularly polarized light (right circularly polarized light or left circularly polarized light), and the dimming filter (ND filter) is capable of controlling (reducing) the intensity of the excitation light entering the gas cell 11. Therefore, even in the case in which the output of the light source 21b is high, it is possible to provide a desired light intensity to the excitation light entering the gas cell 11.

Around the outer circumference 17a extending in parallel to the optical axis direction R of the gas cell holding member 17, there is wound the coil 15 along the outer circumference 17a. The coil 15 has a function of generating a magnetic field due to energization. Thus, by applying the magnetic field to the alkali metal in the gas cell 11, it is possible to enlarge the degenerate gap between the energy levels different from each other of the alkali metal using the Zeeman split to thereby improve the resolution. As a result, the accuracy of the oscillation frequency of the atomic oscillator 100 can be improved. It should be noted that the magnetic field generated by the coil 15 can be either one of a direct-current magnetic field and an alternating-current magnetic field, or can also be a magnetic field obtained by superimposing the direct-current magnetic field and the alternating-current magnetic field on one another. Further, this coil 15 can be a solenoidal coil disposed so as to surround the gas cell 11, or can also be a Helmholtz coil disposed so as to sandwich the gas cell 11.

The light detector 12 is provided at the position opposed to the light emitter 21 along the optical axis direction R across the gas cell 11. The light detector 12 has a function of detecting the intensity of the excitation light LL (first resonance light and second resonance light) described later having been transmitted through the gas cell 11. In the present embodiment, the light detector 12 is bonded to the gas cell holding member 17 via an adhesive. The light detector 12 is not particularly limited providing such excitation light as described above can be detected, and a photodetector (a light receiving element) such as a solar cell or a photodiode can be used as the light detector 12.

Further, the gas cell 11, the gas cell holding member 17, the coil 15, and the light detector 12 are housed inside a first containing housing 14. The first containing housing 14 is provided with a container 14a having a box-like shape, and a lid 14b, and is formed by aligning the lid 14b with the container 14a so as to seal the inside. The first containing housing 14 has a function of blocking magnetism from the outside to the inside of the first containing housing 14, and blocks the magnetism from the outside to the gas cell 11 contained in the first containing housing 14.

As the constituent material of the first containing housing 14, it is further preferable to have a magnetic screening effect, and a soft magnetic material such as iron (Fe), a variety of Fe alloys (ferrosilicon, permalloy, supermalloy, amorphous magnetic alloy, sendust alloy), copper (Cu), or a copper alloy is more preferable. By using such a material as the first containing housing 14, the magnetism (variation of the magnetic field) from the outside can be blocked. Thus, it becomes possible to suppress the influence of the magnetism (variation of the magnetic field) from the outside on the metal atoms in the gas cell 11 to thereby achieve stabilization of the oscillation characteristic as the atomic oscillator 100.

The atomic oscillator 100 according to the present embodiment is provided with a heater 13 as a heating element for heating the gas cell 11, and the heater 13 is disposed outside the first containing housing 14, on an outer surface of the lid 14b in the present example. The heater 13 is a heat generating element (a heat generator) for generating heat due to energization. The heat generated by the heater 13 is transmitted to the gas cell 11 via the first containing housing 14. In the present embodiment, there is illustrated a configuration in which the heater 13 is fixedly bonded to the outer surface of the lid 14b of the first containing housing 14 with a high thermal conductivity adhesive. However, the installation configuration of the heater 13 is not limited to the above, and any installation configuration for reducing the conduction loss of the heat generated by the heater 13 can be adopted. For example, brazing with metal brazing, and a physical fixation method with screws can also be adopted.

The heat generated by the heater 13 is conducted to the gas cell 11, and thus it is possible to keep the gas cell 11 at a predetermined temperature to thereby keep the alkali metal in the gas cell 11 in the gaseous state. As the heater 13, a field-effect transistor or a bipolar transistor is preferably used. By using the field-effect transistor or the bipolar transistor, the temperature control high in followability becomes possible due to the control of the power supply current to be supplied. It should be noted that it is also possible to use a heating resistor or a Peltier element.

Further, in the atomic oscillator 100, there is further provided a second containing housing 18, which contains the first containing housing 14 containing the gas cell 11, the gas cell holding member 17, the coil 15, and the light detector 12, and the heater 13 disposed outside the first containing housing 14, and has a magnetic screening property, to form a gas cell unit 10.

Figure 3:
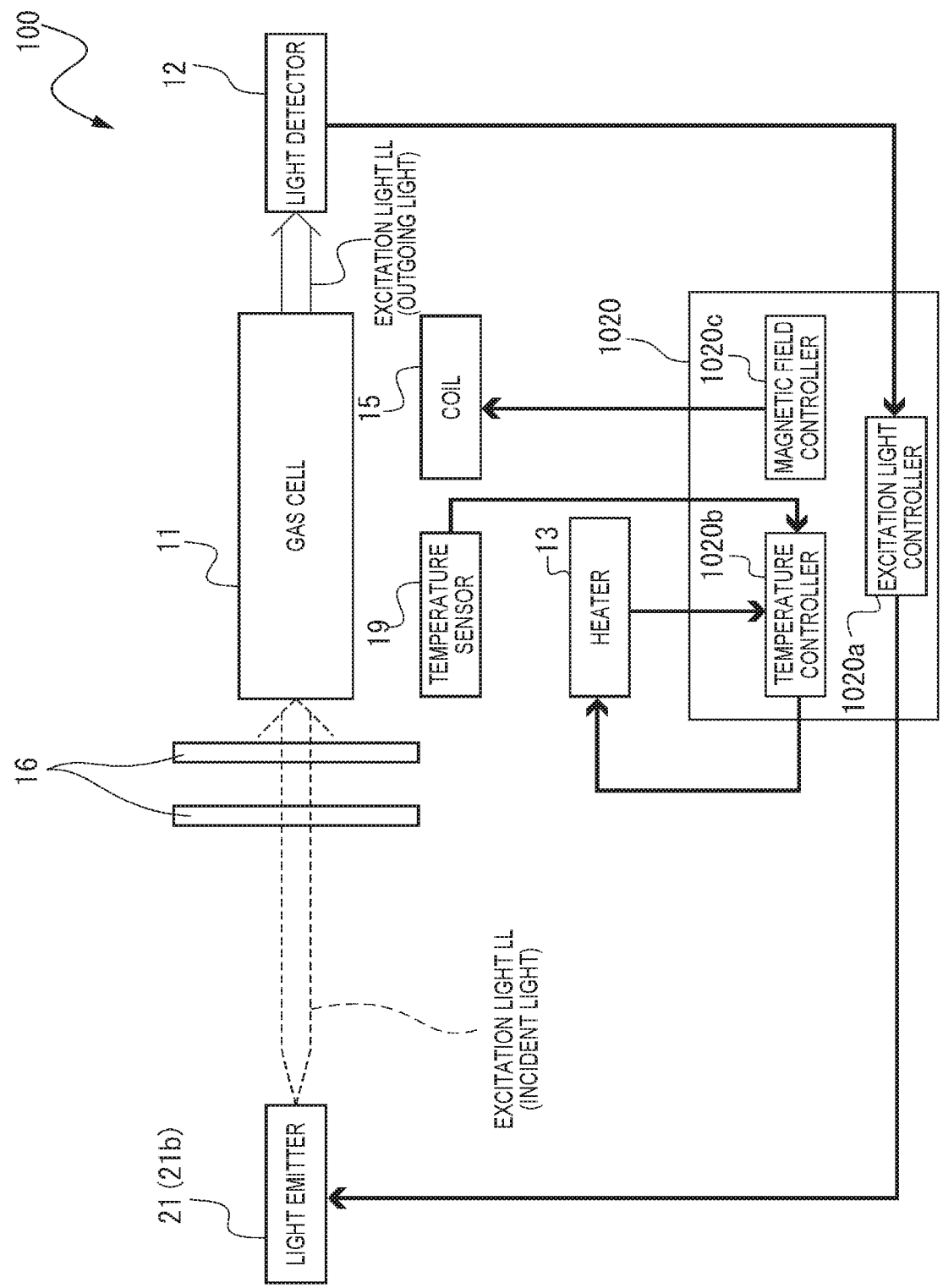
FIG. 3 is a configuration diagram showing a schematic configuration of the atomic oscillator according to the first embodiment.
Figure 4:
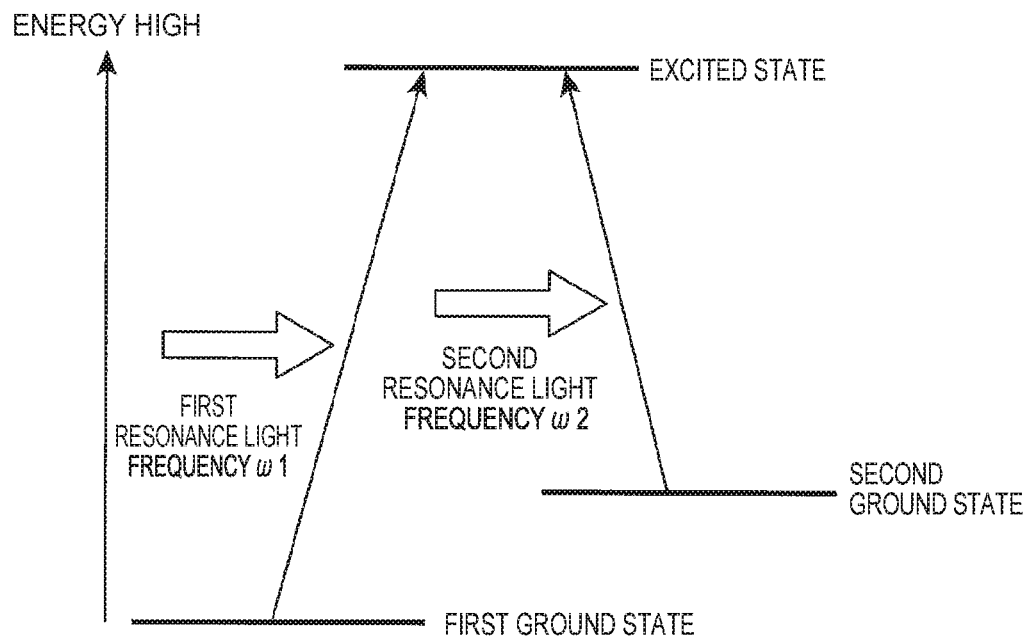
FIG. 4 is a diagram for explaining an energy state of alkali metal in a gas cell of the atomic oscillator according to the first embodiment.
Figure 5:
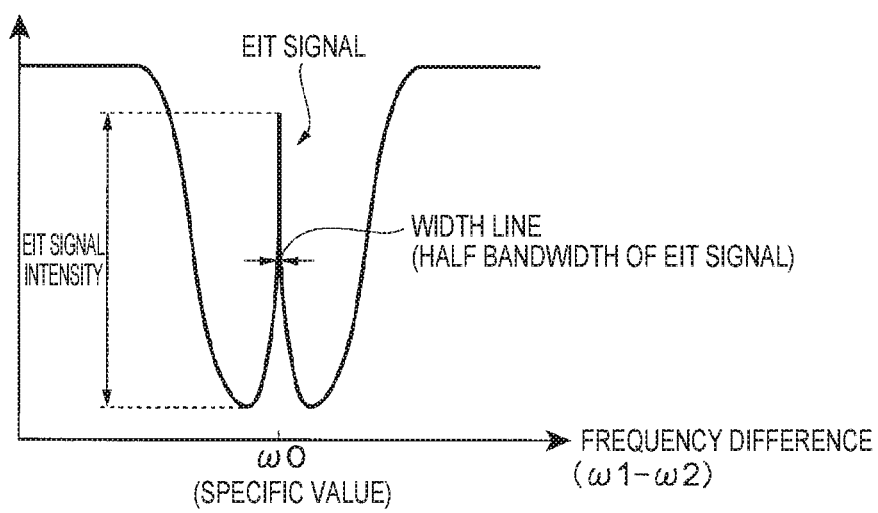
FIG. 5 is a graph showing a relationship between a frequency difference between two light beams from a light emitter (a light source) and detection intensity in a light detector with respect to the light emitter (the light source) and the light detector of the atomic oscillator according to the first embodiment.

FIG. 3 is a configuration diagram showing a schematic configuration of the atomic oscillator 100 shown in FIG. 2. Further, FIG. 4 is an explanatory diagram for describing the energy state of the alkali metal, and FIG. 5 is a graph showing a relationship between a frequency difference between two light beams emitted from the light emitter, and the intensity of the light detected by the light detector.

Here, the principle of the atomic oscillator 100 according to the present embodiment will briefly be described. In the atomic oscillator 100, a gaseous alkali metal (metal atoms) such as rubidium, cesium, or sodium is encapsulated in the gas cell 11. As shown in FIG. 4, the alkali metal has energy levels of the three-level system, and can take three states, namely two ground states (first and second ground states)

different in energy level from each other, and an excited state. Here, the first ground state is an energy state lower than the second ground state.

When irradiating such gaseous alkali metal as described above with the two types of resonance light, namely the first resonance light and the second resonance light, different in frequency from each other, the light absorptance (the light transmittance) of the first resonance light and the second resonance light in the alkali metal varies in accordance with a difference ($\omega 1-\omega 2$) between the frequency $\omega 1$ of the first resonance light and the frequency $\omega 2$ of the second resonance light. Then, when the difference ($\omega 1-\omega 2$) between the frequency $\omega 1$ of the first resonance light and the frequency $\omega 2$ of the second resonance light coincides with the frequency corresponding to the energy difference between the first ground state and the second ground state, the excitation from the first ground state and the second ground state to the excited state stops, respectively. On this occasion, both of the first resonance light and the second resonance light are transmitted without being absorbed by the alkali metal. Such a phenomenon is called coherent population trapping (CPT) phenomenon or electromagnetically induced transparency (EIT).

The light source 21b emits such two types of light (the first resonance light and the second resonance light) different in frequency as described above toward the gas cell 11. For example, in the case in which the light source 21b fixes the frequency $\omega 1$ of the first resonance light and continues to vary the frequency $\omega 2$ of the second resonance light, the detection intensity of the light detector 12 rapidly rises as shown in FIG. 5 when the difference ($\omega 1-\omega 2$) between the frequency $\omega 1$ of the first resonance light and the frequency $\omega 2$ of the second resonance light coincides with the frequency $\omega$ corresponding to the energy difference between the first ground state and the second ground state. Such a rapid signal as described above is detected as an EIT signal. The EIT signal has a fixed characteristic value depending on the type of the alkali metal. Therefore, by using such an EIT signal, an oscillator can be configured.

As shown in FIG. 3, in the atomic oscillator 100 according to the present embodiment, the excitation light LL is emitted from the light source 21b provided to the light emitter 21 toward the gas cell 11 as incident light to the gas cell 11. As the excitation light LL, as described above, the two types of light (the first resonance light and the second resonance light) different in frequency from each other are emitted. The frequency $\omega 1$ of the first resonance light is capable of exciting the alkali metal in the gas cell 11 from the first ground state to the excited state described above. Further, the frequency $\omega 2$ of the second resonance light is capable of exciting the alkali metal in the gas cell 11 from the second ground state to the excited state described above. The light source 21b is not particularly limited providing such excitation light as described above can be emitted, and for example, a semiconductor laser such as a vertical cavity surface emitting laser (VCSEL) can be used as the light source 21b.

The excitation light LL having been emitted from the light source 21b is transmitted through the optical component 16 disposed on the optical axis of the excitation light LL. The optical component 16 is the $\lambda/4$ wave plate and the dimming filter (the ND filter), and the $\lambda/4$ wave plate converts the excitation light LL as the linearly polarized light emitted from the light source 21b into the circularly polarized light (the right circularly polarized light or the left circularly polarized light). Further, the dimming filter (the ND filter) is capable of controlling (reducing) the intensity of the excitation light LL, and even in the case in which the output of the light source 21b is high, it is possible to provide a desired light intensity to the excitation light LL entering the gas cell 11.

By converting the excitation light LL into the circular polarized light using the $\lambda/4$ wave plate as the optical component 16, in the case of irradiating the alkali metal atoms with the excitation light LL as the circularly polarized light in the state in which the alkali metal atoms located in the gas cell 11 are Zeeman-split due to the magnetic field of the coil 15, the number of the alkali metal atoms at the desired energy level out of the plurality of levels, at which the alkali metal atoms are Zeeman-split, can be made relatively large to the number of the alkali metal atoms at other energy levels due to a mutual action between the excitation light LL and the alkali metal atoms. Therefore, the number of the atoms, which develops the desired EIT phenomenon, increases to increase the intensity of the desired EIT signal, and as a result, the oscillation characteristics of the atomic oscillator 100 can be improved.

The intensity of the excitation light LL (the first resonance light and the second resonance light) having been transmitted through the gas cell 11 is detected by the light detector 12. The detection result of the excitation light LL by the light detector 12 is input to an excitation light controller 1020a included in the controller 1020, and the frequencies of the first resonance light and the second resonance light emitted from the light source 21b are controlled based on the detection result of the light detector 12. More specifically, the excitation light controller 1020a controls the frequencies of the first resonance light and the second resonance light emitted from the light source 21b so that the frequency difference ($\omega 1-\omega 2$) detected by the light detector 12 described above becomes equal to the frequency $\omega 0$ inherent in the alkali metal described above. Further, the excitation light controller 1020a controls the central frequency of the first resonance light and the second resonance light emitted from the light source 21b. Thus, it is possible to detect such an EIT signal as described above. Then, the controller 1020 makes the signal of the quartz crystal oscillator not shown be output in sync with the EIT signal.

The controller 1020 includes a temperature controller 1020b and a magnetic field controller 1020c. The temperature controller 1020b controls the energization of the heater 13 based on the measurement detection result from a temperature sensor 19 (not shown in FIG. 2) for detecting the temperature of the gas cell 11 to thereby keep the gas cell 11 within the desired temperature range. The magnetic field controller 1020c controls the energization of the coil 15 so that the magnetic field generated by the coil 15 becomes constant. It should be noted that, although described later, such a controller 1020 as described above is disposed as an electronic circuit device (e.g., a semiconductor device) mounted on the substrate 1010 on which the atomic oscillator 100 is mounted.

As described above, in the atomic oscillator 100 provided to the atomic oscillation device 1000 according to the present embodiment, as shown in FIG. 1, there is disposed a wiring board 40 of the power supply channel for supplying the power to the heater 13 provided to the gas cell unit 10. The wiring board 40 is a so-called flexible board, and is bent so as to be connected to the gas cell unit 10 and a connector 1011 provided to the substrate 1010 as shown in FIG. 6, which is an appearance view along the arrow from the B direction shown in FIG. 1.

Figure 6:
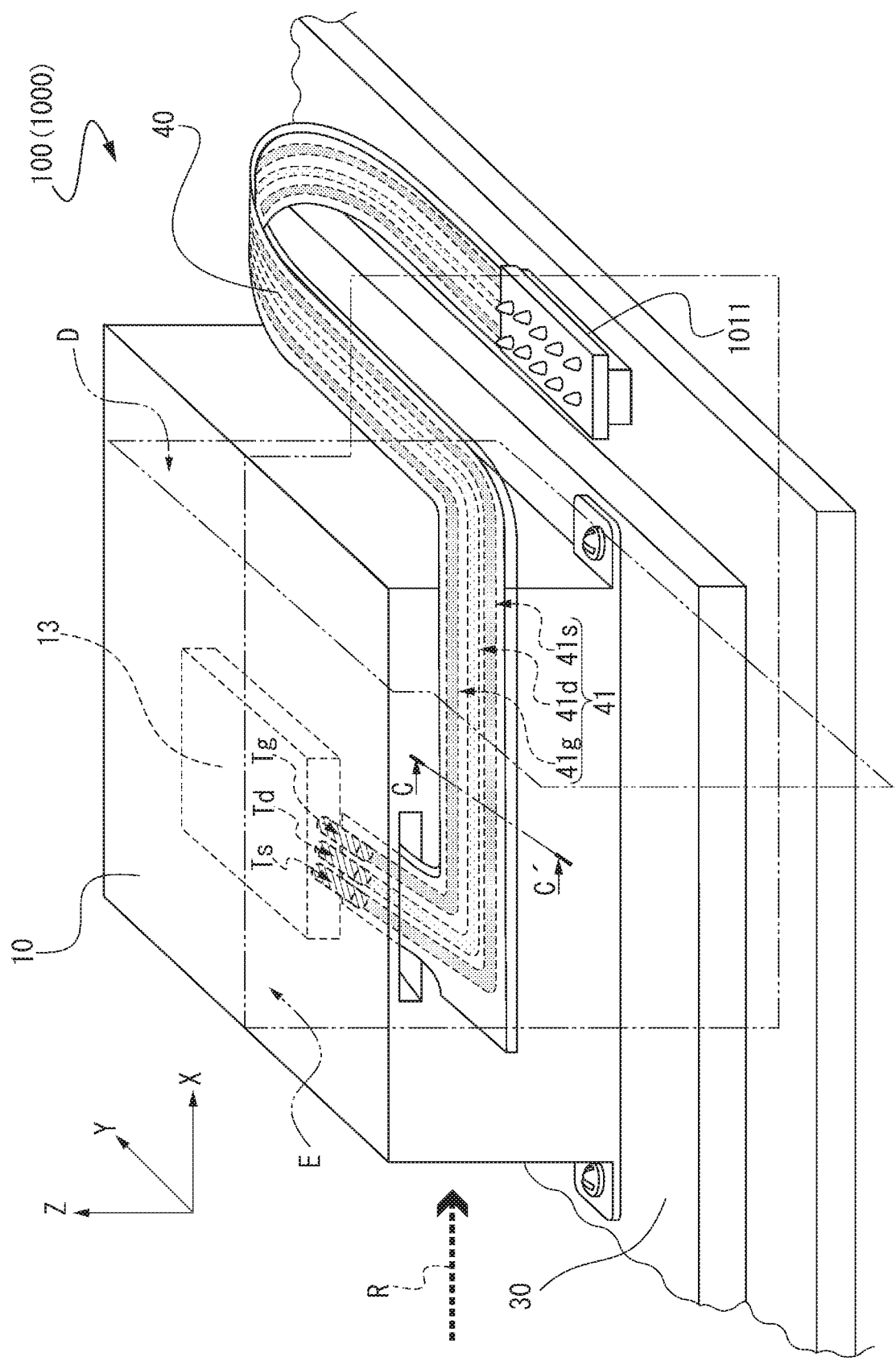
FIG. 6 is an appearance view along the arrow from the B direction shown in FIG. 1.

As shown in FIG. 6, in the atomic oscillator 100 provided to the atomic oscillation device 1000 according to the first embodiment, the heater 13 is disposed inside the gas cell unit 10. Regarding the heater 13, it is preferable to use a field-effect transistor or a bipolar transistor as the heater. In the description of the present example, the field-effect transistor is used as the heater 13. It should be noted that in the following description, the heater 13 is referred to as a transistor heater 13.

The transistor heater 13 is provided with a source terminal Ts and a drain terminal Td as the power input terminals, and a gate terminal Tg, and in the wiring board 40, there is formed board wiring 41 provided at least with a source line 41s as a plus line forming a plus current channel electrically connected to the source terminal Ts, a drain line 41d as a minus line forming a minus current channel electrically connected to the drain terminal Td, and a gate line 41g electrically connected to the gate terminal Tg.

It should be noted that although not shown in the drawings, in the case of using the bipolar transistor as the transistor heater 13, there are provided a collector terminal corresponding to the source terminal Ts and an emitter terminal corresponding to the drain terminal Td as the power input terminals, and a base terminal corresponding to the gate terminal Tg. It results that in the wiring board 40, there is formed the board wiring 41 provided at least with a collector line corresponding to the source line 41s as the plus line electrically connected to the collector terminal, an emitter line corresponding to the drain line 41d as the minus line electrically connected to the emitter terminal, and a base line corresponding to the gate line 41g electrically connected to the base terminal.

Figure 7:
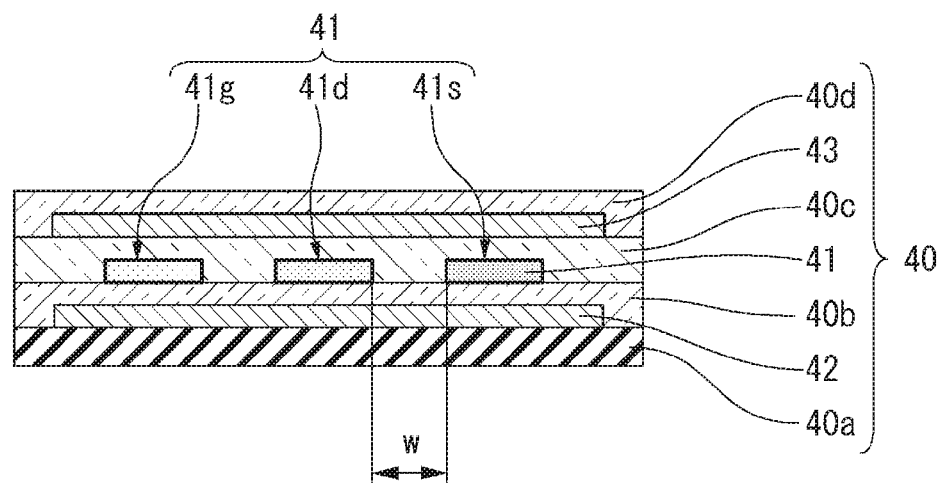
FIG. 7 is an enlarged cross-sectional view of the part C-C' shown in FIG. 6.

FIG. 7 shows an enlarged cross-sectional view of the part C-C' of the wiring board 40 shown in FIG. 6. As shown in FIG. 7, the wiring board 40 is formed by stacking at least a base film 40a, a first ground line 42 (hereinafter referred to as a first ground 42), a first insulating layer 40b, the board wiring 41, a second insulating layer 40c, a second ground line 43 (hereinafter referred to as a second ground 43), and a third insulating layer 40d one another, wherein the base film 40a is an electrical insulator, the first ground line 42 is formed on the base film 40a, the first insulating layer 40b covers the first ground 42, the board wiring 41 is formed on the first insulating layer 40b, the second insulating layer 40c covers the board wiring 41, the second ground line 43 is formed on the second insulating layer 40c, and the third insulating layer 40d covers the second ground 43.

In the board wiring 41, it is preferable to dispose the source line 41s and the drain line 41d adjacent and close to each other. Here, the expression "close to each other" means that the width w of the space shown in the drawing between the source line 41s and the drain line 41d is set as narrow as possible within the range in which the second insulating layer 40c is disposed in the space w shown in the drawing and thus the electrically insulating property can be maintained. It should be noted that although in the present example, the drain line 41d is disposed between the gate line 41g and the source line 41s, it is also possible to dispose the source line 41s between the gate line 41g and the drain line 41d. It is preferable to at least prevent the gate line 41g from being disposed between the source line 41s and the drain line 41d.

By disposing the source line 41s as the plus line and the drain line 41d as the minus line for supplying the transistor heater 13 with power close to each other as described above, it is possible to reduce the influence of the magnetic field, which is generated by the current flowing through the lines 41s, 41d, exerted on the magnetic field excited along the optical axis direction R by the coil 15 provided to the gas cell 11. It should be noted that the current flowing through the gate line 41g is faint, and the magnetic field generated is also faint, and therefore, the influence on the gas cell 11 is in a negligible level.

Figure 8:
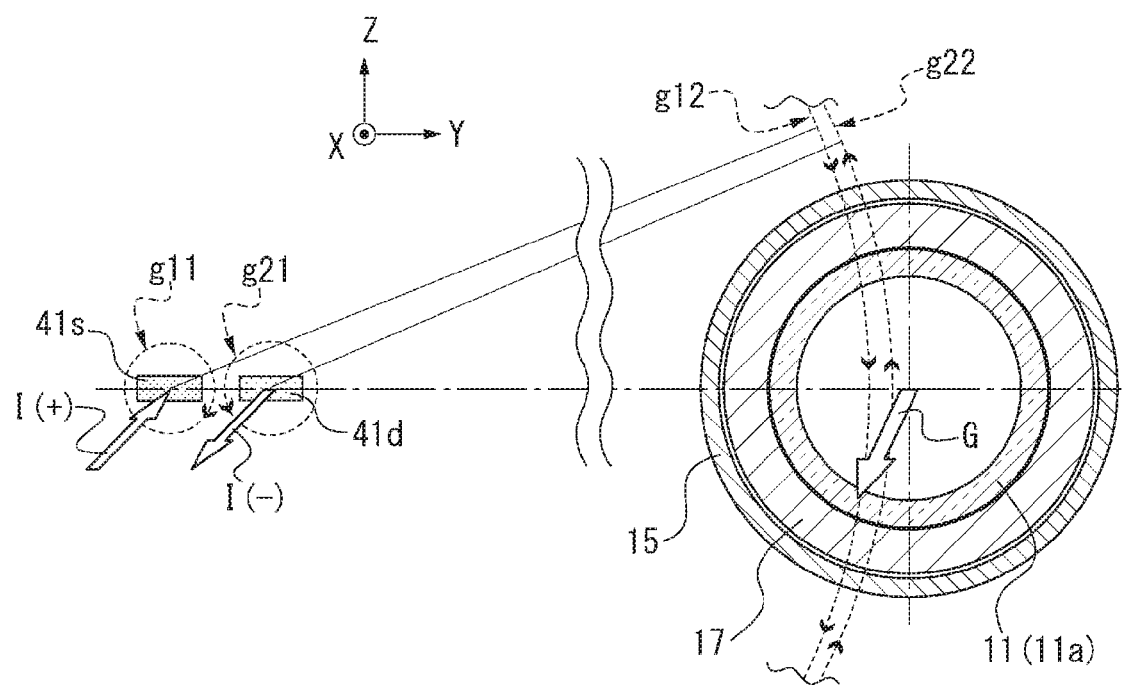
FIG. 8 is a schematic diagram for explaining a generated magnetic field in the cross-sectional part along the plane D shown in FIG. 6.
Figure 9:
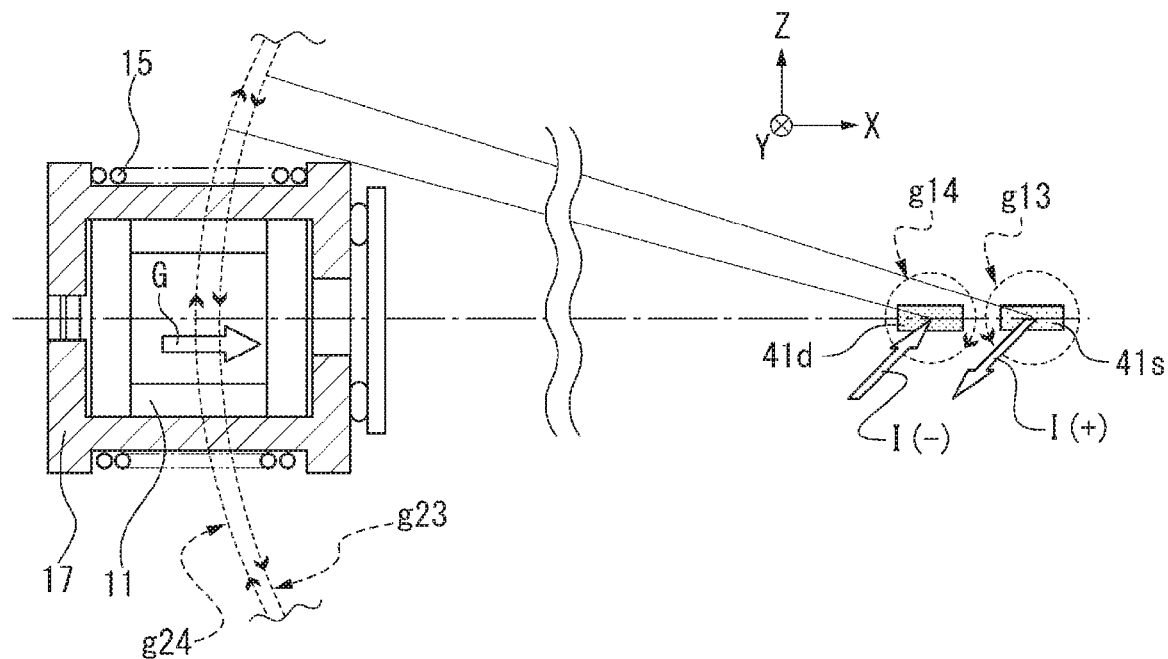
FIG. 9 is a schematic diagram for explaining a generated magnetic field in the cross-sectional part along the plane E shown in FIG. 6.

FIG. 8 and FIG. 9 are diagrams schematically showing the relationship between the magnetic fields generated from the source line 41s and the drain line 41d, and the magnetic field excited by the coil 15 in the gas cell 11. FIG. 8 schematically shows the cross-sectional part along the plane D in the Y-Z plane crossing the optical axis direction R shown in FIG. 6. FIG. 9 schematically shows the cross-sectional part along the plane E in the X-Z plane along the optical axis direction R shown in FIG. 6.

As shown in FIG. 8, the plus current I(+) flows through the source line 41s as the plus line in the direction shown in the drawing, and the minus current I(−) flows through the drain line 41d as the minus line in the direction shown in the drawing. On this occasion, a clockwise magnetic field line g11 is generated in the drawing due to the current I(+) in the periphery of the source line 41s. Further, a counterclockwise magnetic field line g21 is generated in the drawing due to the current I(−) in the periphery of the drain line 41d.

Between the source line 41s and the drain line 41d, the magnetic field line g11 and the magnetic field line g21 of the magnetic fields generated act on each other in the directions of reinforcing each other. However, in an area of the gas cell 11 distantly located from the wiring board 40 provided with the source line 41s and the drain line 41d, the direction of the magnetic field line g12 of the magnetic field generated from the source line 41s and the direction of the magnetic field line g22 of the magnetic field generated from the drain line 41d become opposite to each other, and the magnetic fields act on each other so as to cancel out each other. Therefore, it is possible to prevent the influence of the magnetic fields respectively excited by the current flowing through the source line 41s as the plus line provided to the wiring board 40 and the current flowing through the drain line 41d as the minus line from being exerted on the magnetic field line G of the magnetic field excited by the coil 15 in the direction shown in the drawing along the optical axis direction R in the gas cell 11 located distantly from the wiring board 40.

As shown in FIG. 9, which is the schematic diagram of the cross-sectional part along the plane E shown in FIG. 6, the plus current I(+) flows through the source line 41s as the plus line in the direction shown in the drawing, and the minus current I(−) flows through the drain line 41d as the minus line in the direction shown in the drawing. On this occasion, a counterclockwise magnetic field line g13 is generated in the drawing due to the current I(+) in the periphery of the source line 41s. Further, a clockwise magnetic field line g14 is generated in the drawing due to the current I(−) in the periphery of the drain line 41d.

Between the source line 41s and the drain line 41d, the magnetic field line g13 and the magnetic field line g14 of the magnetic fields generated act on each other in the directions of reinforcing each other. However, in an area of the gas cell 11 distantly located from the wiring board 40 provided with the source line 41s and the drain line 41d, the direction of the magnetic field line g23 of the magnetic field generated from the source line 41s and the direction of the magnetic field line g24 of the magnetic field generated from the drain line 41d become opposite to each other, and the magnetic fields act on each other so as to cancel out each other. Therefore, it is possible to prevent the influence of the magnetic fields respectively excited by the current flowing through the source line 41s as the plus line provided to the wiring board 40 and the current flowing through the drain line 41d as the minus line from being exerted on the magnetic field line G of the magnetic field excited by the coil 15 in the direction along the optical axis direction R shown in the drawing in the gas cell 11 located distantly from the wiring board 40.

The intensity of each of the magnetic field lines g11, g21, g12, g22, g13, g23, g14 and g24 is inversely proportional to the square of the distance from corresponding one of the lines 41s, 41d as the generation source of the magnetic field. Therefore, by making the distance between the source line 41s and the drain line 41d shorter, namely by making the source line 41s and the drain line 41d closer to each other, the magnetic field lines transmitted through the gas cell 11 in the respective directions opposite to each other become roughly the same in intensity, and it is possible to more reliably cancel out the magnetic field lines in the area of the gas cell 11.

Further, as shown in FIG. 7, in the wiring board 40 for supplying the power to the transistor heater 13 of the atomic oscillator 100 provided to the atomic oscillation device 1000 according to the present embodiment, the board wiring 41 is stacked between the first ground 42 and the second ground 43 via the insulating layers 40b, 40c. In other words, the board wiring 41 is sandwiched by the first ground 42 and the second ground 43. Thus, the first ground 42 and the second ground 43 function as a magnetic shielding for preventing the magnetic field generated from the board wiring 41 from leaking to the outside.

Therefore, in the atomic oscillation device 1000 according to the present embodiment, by disposing the source line 41s and the drain line 41d provided to the wiring board 40 close to each other, the magnetic field lines respectively generated from the source line 41s and the drain line 41d are made to cancel out each other in the area of the gas cell 11, and thus, it is possible to eliminate one factor for destabilizing the magnetic field G in the gas cell 11 excited by the coil 15. Further, by configuring the wiring board 40 so that the board wiring 41 is sandwiched by the first ground 42 and the second ground 43, it is possible to prevent the leakage of the magnetic field from the wiring board 40.

Second Embodiment

Figure 10:
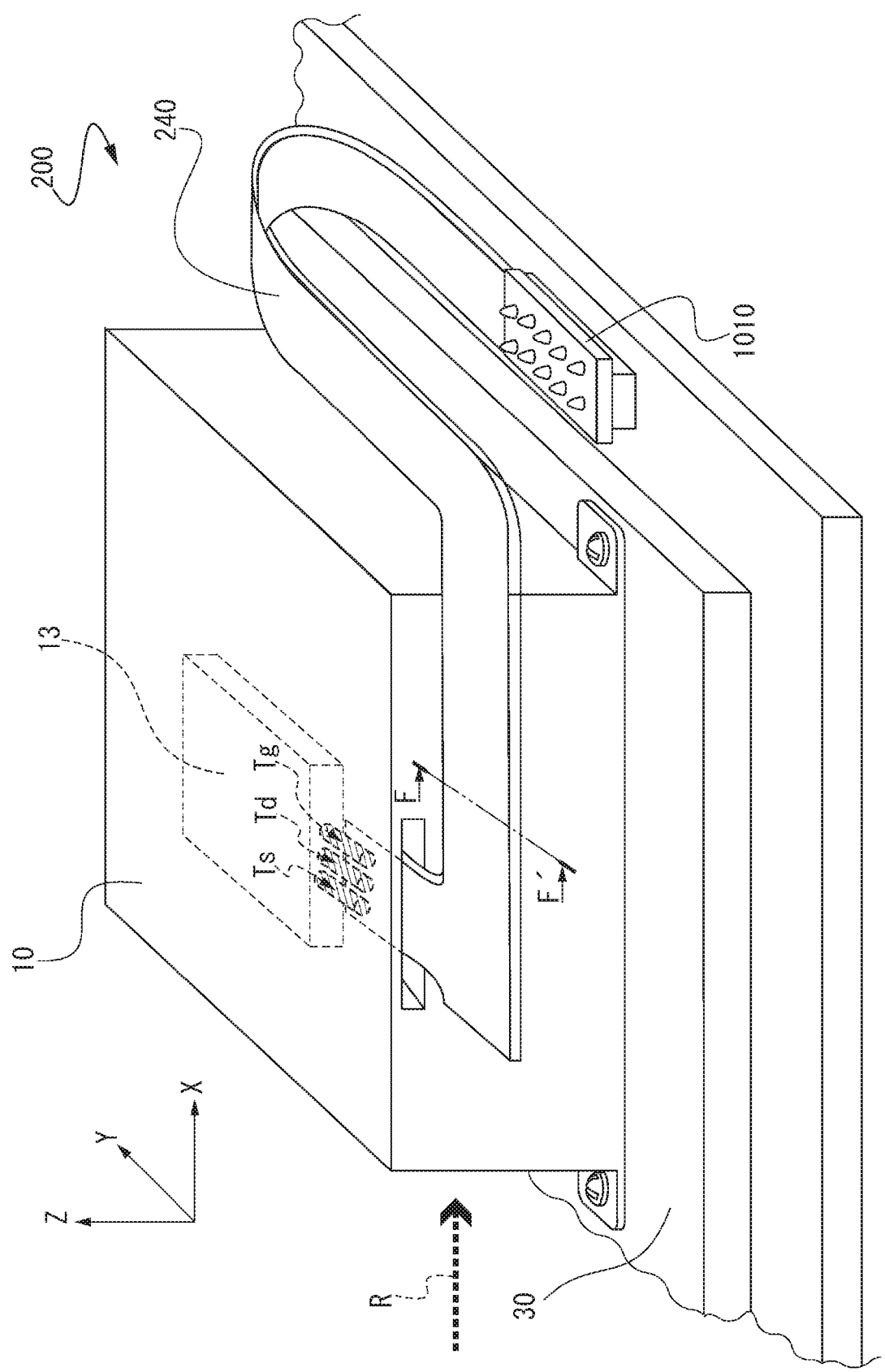
FIG. 10 is an external perspective view showing an atomic oscillator according to a second embodiment of the invention.

FIG. 10 is an external perspective view showing an atomic oscillator 200 according to a second embodiment, and corresponds to FIG. 6 showing the atomic oscillator 100 according to the first embodiment. The atomic oscillator 200 according to the present embodiment is different only in the configuration of the wiring board 40 provided to the atomic oscillator 100 according to the first embodiment, and is the same in other constituents, and therefore, the same constituents are denoted by the same reference symbols, and the description thereof will be omitted.

As shown in FIG. 10, in the atomic oscillator 200 according to the present embodiment, the power is supplied to the transistor heater 13 provided to the gas cell unit 10 via a wiring board 240.

Figure 11:
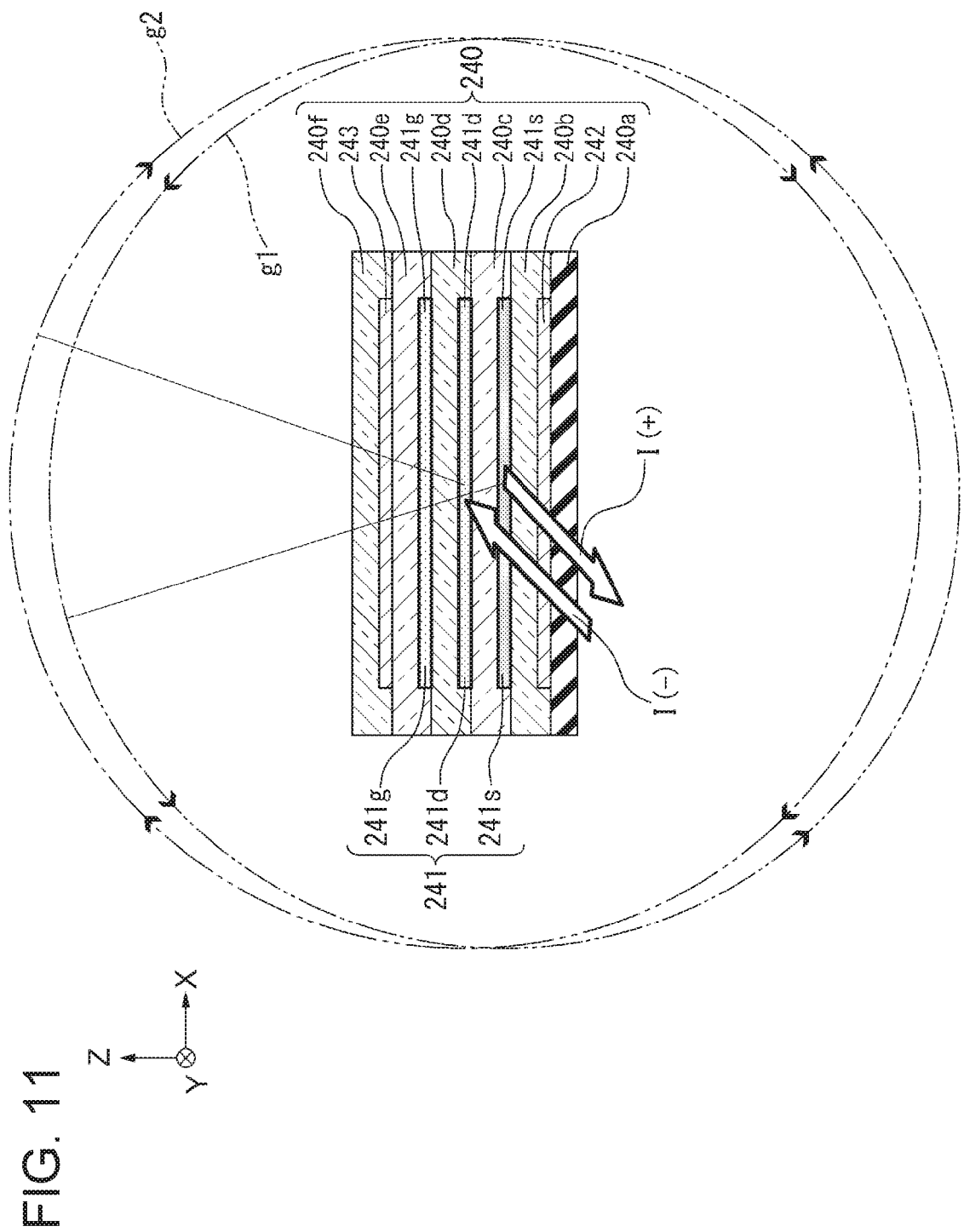
FIG. 11 is an enlarged cross-sectional view of the part F-F' in FIG. 10.

FIG. 11 is an enlarged cross-sectional view showing the cross-section of the part F-F' of the wiring board 240 shown in FIG. 10. As shown in FIG. 11, the wiring board 240 is formed by stacking at least a base film 240a, a first ground line 242 (hereinafter referred to as a first ground 242), a first insulating layer 240b, a source line 241s, a second insulating layer 240c, a drain line 241d, a third insulating layer 240d, a gate line 241g, a fourth insulating layer 240e, a second ground line 243 (hereinafter referred to as a second ground 243), and a fifth insulating layer 240f one another, wherein the base film 240a is an electrical insulator, the first ground line 242 is formed on the base film 240a, the first insulating layer 240b covers the first ground 242, the source line 241s as the plus line is formed on the first insulating layer 240b, the second insulating layer 240c covers the source line 241s, the drain line 241d as the minus line is formed on the second insulating layer 240c, the third insulating layer 240d covers the drain line 241d, the gate line 241g is formed on the third insulating layer 240d, the fourth insulating layer 240e covers the gate line 241g, the second ground line 243 is formed on the fourth insulating layer 240e, and the fifth insulating layer 240f covers the second ground 243.

In other words, the source line 241s, the drain line 241d, and the gate line 241g constituting the board wiring 241 are disposed in a layered manner. Further, in the board wiring 241, it is preferable for the source line 241s and the drain line 241d to be disposed vertically adjacent to each other via the second insulating layer 240c. In other words, it is preferable to adopt a configuration in which the gate line 241g is disposed so as not to be sandwiched by the source line 241s and the drain line 241d.

Further, it is preferable for the second insulating layer 240c disposed between the source line 241s and the drain line 241d to be formed as thin as possible within the range in which the electrically insulating property between the source line 241s and the drain line 241d can be maintained to thereby make the source line 241s and the drain line 241d close to each other.

As shown in FIG. 11, the plus current I(+) flows through the source line 241s in the arrow direction shown in the drawing, and the minus current I(−) flows through the drain line 241d in the arrow direction shown in the drawing. Thus, the source line 241s and the drain line 241d each generate a magnetic field.

A counterclockwise magnetic field line g1 shown in the drawing is excited from the source line 241s, and a clockwise magnetic field line g2 shown in the drawing is excited from the drain line 241d. Therefore, since the magnetic field lines g1, g2 are excited in the respective rotational directions opposite to each other, the magnetic fields are canceled out each other as a result. Therefore, generation of the magnetic field from the wiring board 240 is suppressed, and it is possible to prevent the magnetic field from the wiring board 240 from affecting the magnetic field line of the gas cell 11 excited by the coil 15 provided to the gas cell unit 10 disposed in the vicinity of the wiring board 240 shown in FIG. 10.

Further, as shown in FIG. 11, the board wiring 241 is stacked between the first ground 242 and the second ground 243 via the insulating layers 240b, 240c, 240d, and 240e. In other words, the board wiring 241 is sandwiched by the first ground 242 and the second ground 243. Thus, the first ground 242 and the second ground 243 function as a magnetic shielding for preventing the magnetic field generated from the board wiring 241 from leaking to the outside.

Therefore, in the atomic oscillator 200 according to the present embodiment, the source line 241s and the drain line 241d provided to the wiring board 240 are vertically stacked one another to thereby be disposed close to each other. Therefore, it is possible to make the magnetic field lines respectively generated from the source line 241s and the drain line 241d cancel out each other, and thus, it is possible to eliminate one factor for destabilizing the magnetic field in the gas cell 11 excited by the coil 15. Further, by configuring the wiring board 240 so that the board wiring 241 is sandwiched by the first ground 242 and the second ground 243, it is possible to prevent the leakage of the magnetic field from the wiring board 240.

Third Embodiment

Figure 12:
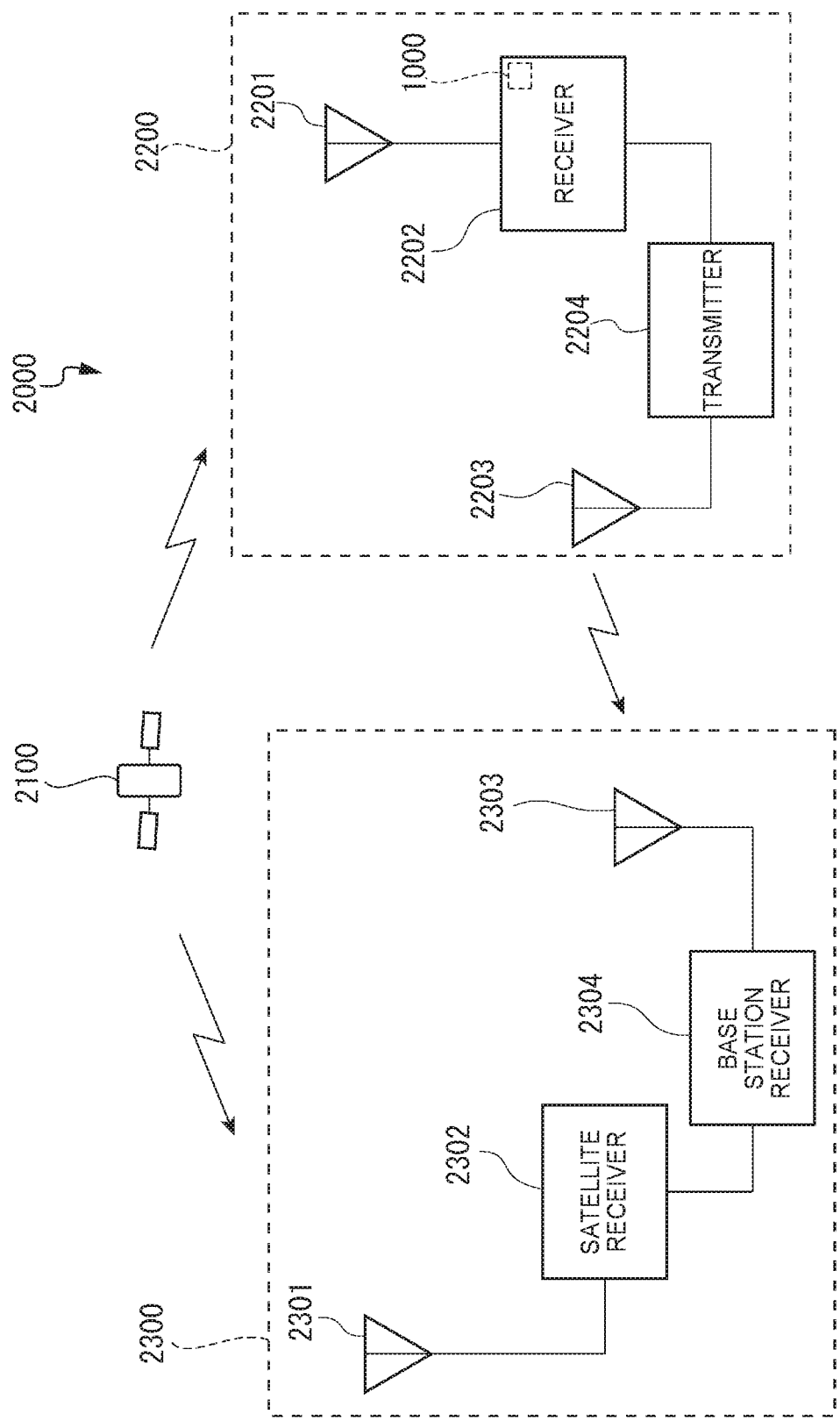
FIG. 12 is a diagram showing a schematic configuration of a positioning system using a GPS satellite as an example of an electronic apparatus according to a third embodiment of the invention.

As a third embodiment, a positioning system using a GPS satellite will be described as an example of an electronic apparatus equipped with the atomic oscillation device 1000 provided with the atomic oscillator 100 according to the first embodiment or the atomic oscillator 200 according to the second embodiment. FIG. 12 is a diagram showing a schematic configuration in the case of using the atomic oscillation device 1000 for the positioning system using the GPS satellite.

The positioning system 2000 shown in FIG. 12 is constituted by the GPS satellite 2100, a base station device 2200, and a GPS receiver 2300. The GPS satellite 2100 transmits positioning information (a GPS signal). The base station device 2200 is provided with a receiver 2202 for accurately receiving the positioning information from the GPS satellite 2100 via an antenna 2201 installed at, for example, an electronic reference point (a GPS continuous observation station), and a transmitter 2204 for transmitting the positioning information, which has been received by the receiver 2202, via an antenna 2203.

Here, the receiver 2202 is an electronic device equipped with the atomic oscillation device 1000 according to the first embodiment described above as a reference frequency oscillation source for the receiver 2202. Such a receiver 2202 has excellent reliability. Further, the positioning information having been received by the receiver 2202 is transmitted by the transmitter 2204 in real time. The GPS receiver 2300 is provided with a satellite receiver 2302 for receiving the positioning information from the GPS satellite 2100 via an antenna 2301, and a base station receiver 2304 for receiving the positioning information from the base station device 2200 via an antenna 2303.

Fourth Embodiment

Figure 13:
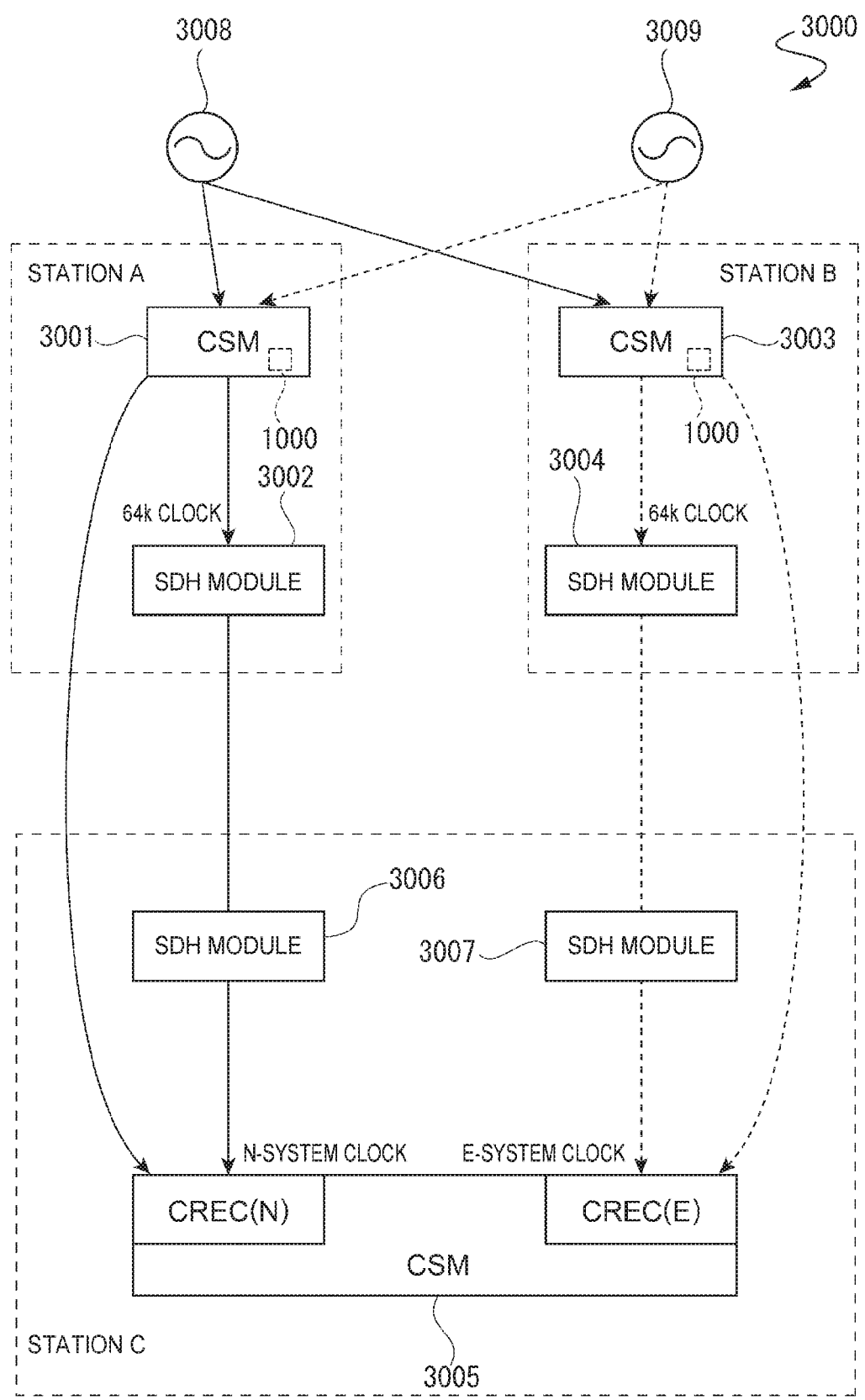
FIG. 13 is a schematic configuration diagram showing a clock transmission system as an example of the electronic apparatus according to a fourth embodiment of the invention.

As a fourth embodiment, a clock transmission system using will be described as an example of an electronic apparatus equipped with the atomic oscillation device 1000 provided with the atomic oscillator 100 according to the first embodiment or the atomic oscillator 200 according to the second embodiment. FIG. 13 is a diagram showing a schematic configuration in the case of using the atomic oscillation device 1000 for the clock transmission system.

The clock transmission system 3000 shown in FIG. 13 is for synchronizing clocks of devices in a time-division multiplexing network with each other, and is a system having a redundant configuration of a normal (N) system and an emergency (E) system.

This clock transmission system 3000 is provided with a clock supply module (CSM) 3001 and a synchronous digital hierarchy (SDH) module 3002 of a station A (higher level (N system)), a clock supply module 3003 and an SDH module 3004 of a station B (higher level (E system)), and a clock supply module 3005 and SDH modules 3006, 3007 of a station C (lower level). The clock supply module 3001 has the atomic oscillation device 1000, and generates a clock signal of the N system. The atomic oscillation device 1000 in the clock supply module 3001 generates a clock signal in sync with clock signals higher in accuracy from the master clock devices 3008, 3009 each including the atomic oscillator 100 or the atomic oscillator 200 using cesium.

The SDH module 3002 performs transmission and reception of a principal signal based on the clock signal from the clock supply module 3001, and at the same time superimposes the clock signal of the N system on the principal signal, and then transmits the result to the lower-level clock supply module 3005. The clock supply module 3003 has the atomic oscillation device 1000, and generates a clock signal of the E system. The atomic oscillation device 1000 in the clock supply module 3003 generates a clock signal in sync with the clock signals higher in accuracy from the master clock devices 3008, 3009 each including the atomic oscillator 100 or the atomic oscillator 200 using cesium.

The SDH module 3004 performs transmission and reception of a principal signal based on the clock signal from the clock supply module 3003, and at the same time superimposes the clock signal of the E system on the principal signal, and then transmits the result to the lower-level clock supply module 3005. The clock supply module 3005 receives the clock signals from the clock supply modules 3001, 3003, and then generates a clock signal in sync with the clock signals thus received.

Here, normally, the clock supply module 3005 generates the clock signal in sync with the clock signal of the N system from the clock supply module 3001. Then, in the case in which an abnormality arises in the N system, the clock supply module 3005 generates the clock signal in sync with the clock signal of the E system from the clock supply module 3003. By making the switch from the N system to the E system in such a manner, it is possible to ensure stable clock supply to thereby increase the reliability of the clock path. The SDH module 3006 performs transmission and reception of the principal signal based on the clock signal from the clock supply module 3005. Similarly, the SDH module 3007 performs transmission and reception of the principal signal based on the clock signal from the clock supply module 3005. Thus, it is possible to synchronize the devices in the station C with the devices in the station A or the station B.

Fifth Embodiment

Figure 14:
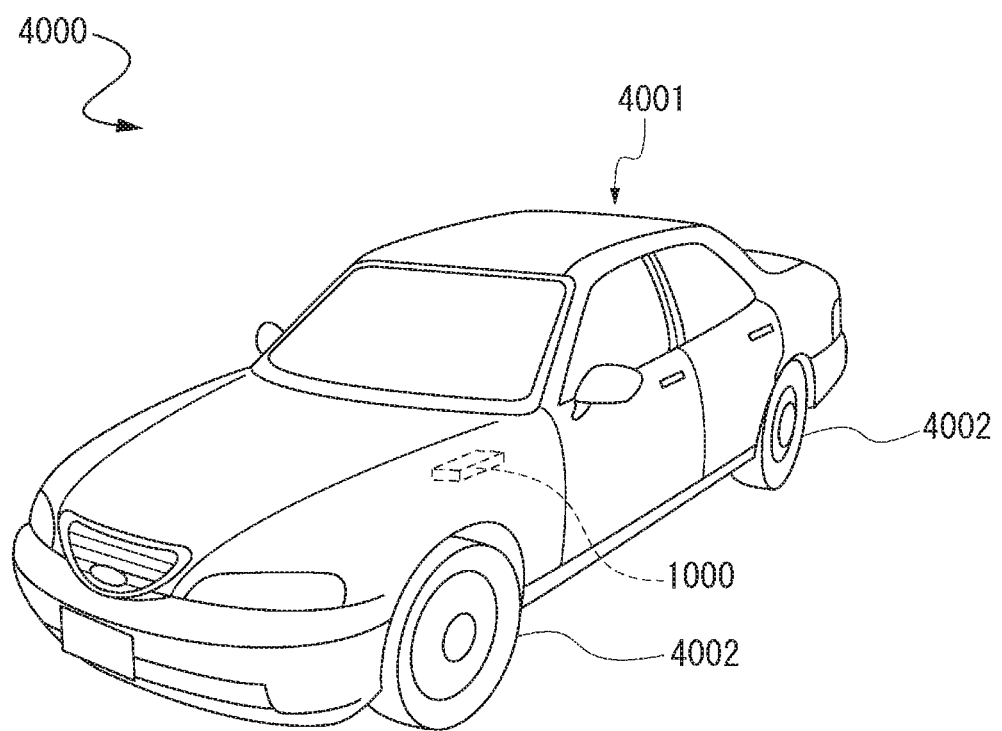
FIG. 14 is a perspective view showing a configuration of a car as an example of a vehicle according to a fifth embodiment of the invention.

As a fifth embodiment, a car will be described as an example of a vehicle equipped with the atomic oscillation device 1000 provided with the atomic oscillator 100 according to the first embodiment or the atomic oscillator 200 according to the second embodiment. FIG. 14 is a perspective view showing a schematic configuration in the case of using the atomic oscillation device 1000 in the car as the vehicle.

The car 4000 as the vehicle shown in FIG. 14 has a car body 4001, and four wheels 4002, and is configured so as to rotate the wheels 4002 with a power source not shown provided to the car body 4001. Such a car 4000 incorporates the atomic oscillation device 1000. Further, a controller not shown, for example, controls the drive of the power source based on the oscillation signal from the atomic oscillation device 1000.

It should be noted that, the electronic apparatus or the vehicle incorporating the atomic oscillation device equipped with the atomic oscillator according to the invention is not limited to those described above, but can also be applied to, for example, a cellular phone, a digital still camera, an inkjet ejection device (e.g., an inkjet printer), a personal computer (a mobile personal computer, a laptop personal computer), a television set, a video camera, a video cassette recorder, a car navigation system, a pager, a personal digital assistance (including one with communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator.

Although the atomic oscillator according to the invention is hereinabove described based on the embodiments shown in the accompanying drawings, the invention is not limited to these embodiments, but the configuration of each of the sections of the embodiments described above can be replaced with one having an arbitrary configuration with an equivalent function, or can also be added with an arbitrary configuration. Further, the invention can be a combination of any of constituents in each of the embodiments described above.

What is claimed is:

1. An atomic oscillator comprising:
   a gas cell encapsulating metal atoms;
   a coil disposed in a periphery of the gas cell;
   a laser source adapted to emit excitation light toward the gas cell;
   a heater adapted to heat the gas cell;
   a wiring board that is connected to a first side of the heater to supply power only to the heater via positive and negative power wires therein; and
   a package that houses the gas cell, the coil, the heater, and a proximal end of the wiring board with respect to the heater, the laser source being spaced apart from the package, the package having an opening on a first side wall through which the wiring board passes,
   wherein the positive and negative power wires are adjacent to each other in the wiring board, and
   the first side wall of the package is located closer to the first side of the heater than other sides of the heater.

2. The atomic oscillator according to claim 1, wherein
   the wiring board is a flexible board, and
   the positive power wire and the negative power wire are stacked on each other with an insulating layer therebetween.

3. The atomic oscillator according to claim 2, wherein
   the wiring board has a gate wire therein,
   the heater is a field-effect transistor,
   the positive wire is connected to a source terminal of the field-effect transistor,
   the negative power wire is connected to a drain terminal of the field-effect transistor, and
   the gate wire to be connected to a gate terminal of the field-effect transistor is adjacent to either one of the positive power wire and the negative power wire with an insulating layer therebetween.

4. The atomic oscillator according to claim 2, wherein
   the wiring board has a base wire therein,
   the heater is a bipolar transistor,
   the positive power wire is connected to a collector terminal of the bipolar transistor,
   the negative power wire is connected to an emitter terminal of the bipolar transistor, and
   the base wire to be connected to a base terminal of the bipolar transistor is adjacent to either one of the positive power wire and the negative power wire with an insulating layer therebetween.

5. The atomic oscillator according to claim 2, wherein
   the flexible board further includes two ground wires, and
   the two ground wires sandwich the positive power wire and the negative power wire with insulating layers therebetween in a stacked direction.

* * * * *